(12) United States Patent
Fujiwara et al.

(10) Patent No.: US 11,562,946 B2
(45) Date of Patent: Jan. 24, 2023

(54) MEMORY MACRO INCLUDING THROUGH-SILICON VIA

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Hidehiro Fujiwara, Hsinchu (TW); Tze-Chiang Huang, Hsinchu (TW); Hong-Chen Cheng, Hsinchu (TW); Yen-Huei Chen, Hsinchu (TW); Hung-Jen Liao, Hsinchu (TW); Jonathan Tsung-Yung Chang, Hsinchu (TW); Yun-Han Lee, Hsinchu (TW); Lee-Chung Lu, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 17/209,878

(22) Filed: Mar. 23, 2021

(65) Prior Publication Data
US 2022/0293492 A1    Sep. 15, 2022

(30) Foreign Application Priority Data
Mar. 11, 2021    (CN) .......................... 202110263207.8

(51) Int. Cl.
*G11C 11/00*      (2006.01)
*H01L 23/48*      (2006.01)
(Continued)

(52) U.S. Cl.
CPC .......... *H01L 23/481* (2013.01); *G11C 11/418* (2013.01); *H01L 21/76898* (2013.01); *H01L 27/1116* (2013.01)

(58) Field of Classification Search
CPC ............................ G11C 11/418; G11C 11/419
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |

(Continued)

FOREIGN PATENT DOCUMENTS

| KR | 20080070097 | 7/2008 |
| KR | 20100003237 | 1/2010 |

(Continued)

OTHER PUBLICATIONS

Office Action dated Nov. 11, 2021 for corresponding case No. DE 10 2021 107 795.8 (pp. 1-4).

*Primary Examiner* — Pho M Luu
(74) *Attorney, Agent, or Firm* — Hauptman Ham, LLP

(57) ABSTRACT

A memory macro structure includes a first memory array, a second memory array, a cell activation circuit coupled to the first and second memory arrays and positioned between the first and second memory arrays, a control circuit coupled to the cell activation circuit and positioned adjacent to the cell activation circuit, and a through-silicon via (TSV) extending through one of the cell activation circuit or the control circuit.

20 Claims, 12 Drawing Sheets

(51) Int. Cl.
    *G11C 11/418*     (2006.01)
    *H01L 21/768*     (2006.01)
    *H01L 27/11*     (2006.01)

(56)     References Cited

U.S. PATENT DOCUMENTS

| | | | |
|---|---|---|---|
| 9,779,801 B2 * | 10/2017 | Tao | G11C 7/227 |
| 9,824,729 B2 * | 11/2017 | Su | G11C 11/419 |
| 10,817,420 B2 * | 10/2020 | Chong | G06F 12/0223 |
| 2003/0072201 A1 | 4/2003 | Inaba | |
| 2007/0158695 A1 | 7/2007 | Kitsukawa et al. | |
| 2008/0179734 A1 | 7/2008 | Kwon et al. | |
| 2009/0321089 A1 | 12/2009 | Somasekhar et al. | |
| 2014/0040838 A1 | 2/2014 | Liu et al. | |
| 2014/0063887 A1 | 3/2014 | Vogelsang | |
| 2015/0278429 A1 | 10/2015 | Chang | |
| 2019/0295604 A1 | 9/2019 | Vogelsang | |
| 2019/0379380 A1 | 12/2019 | Atsatt | |

FOREIGN PATENT DOCUMENTS

| | | |
|---|---|---|
| TW | 201937498 | 9/2019 |
| TW | 202005127 | 1/2020 |
| TW | 202105380 | 2/2021 |

\* cited by examiner

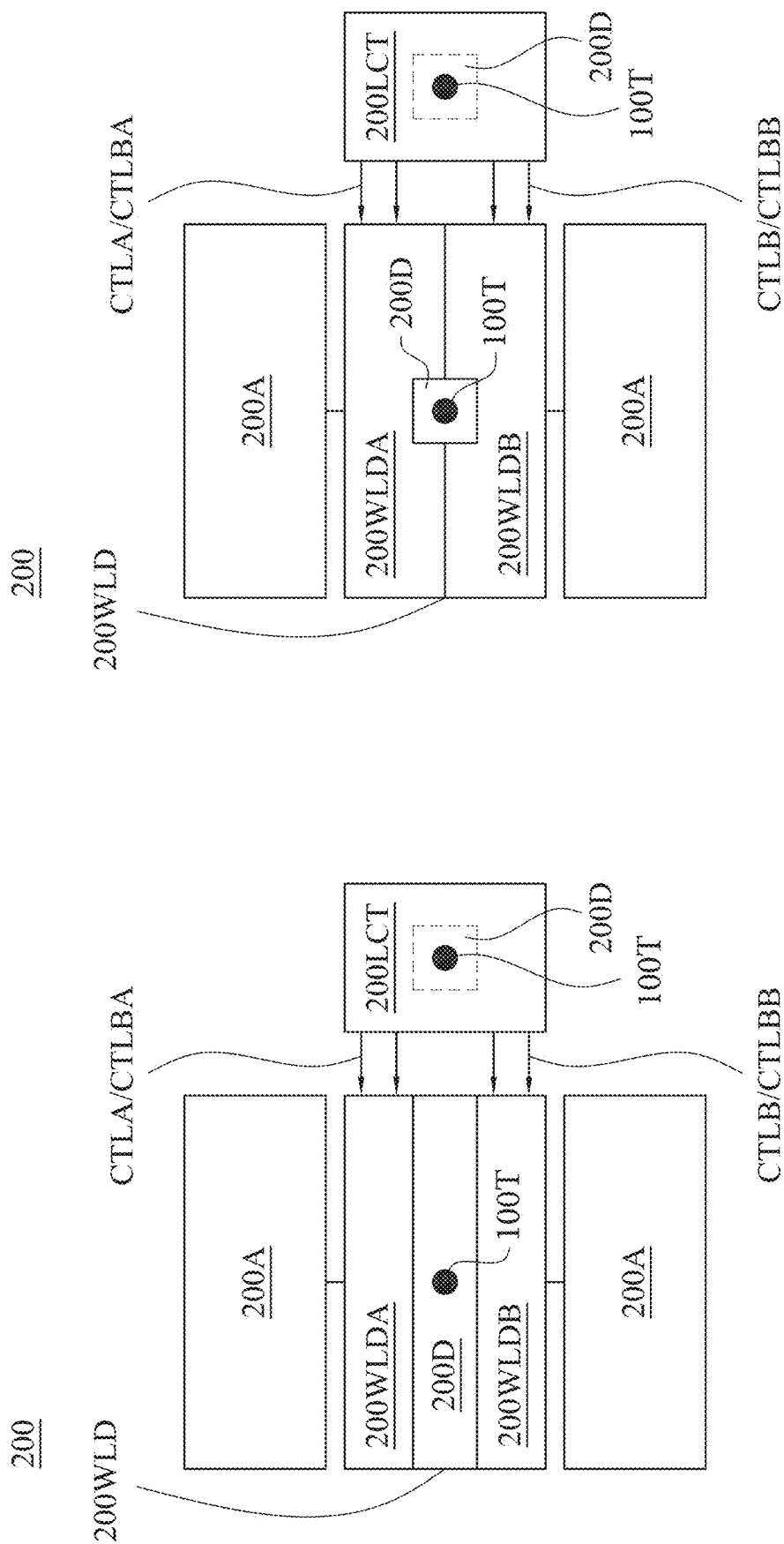

MEMORY MACRO INCLUDING THROUGH-SILICON VIA

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications.

IC packages are often used for applications in which power is distributed among one or more IC dies. In some cases, dies are stacked in three-dimensional (3D) arrangements in which power distribution relies on through-silicon vias (TSVs) in one or more of the stacked IC dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are diagrams of portions of memory macro structures, in accordance with some embodiments.

DETAILED DESCRIPTION

Figure 1A:
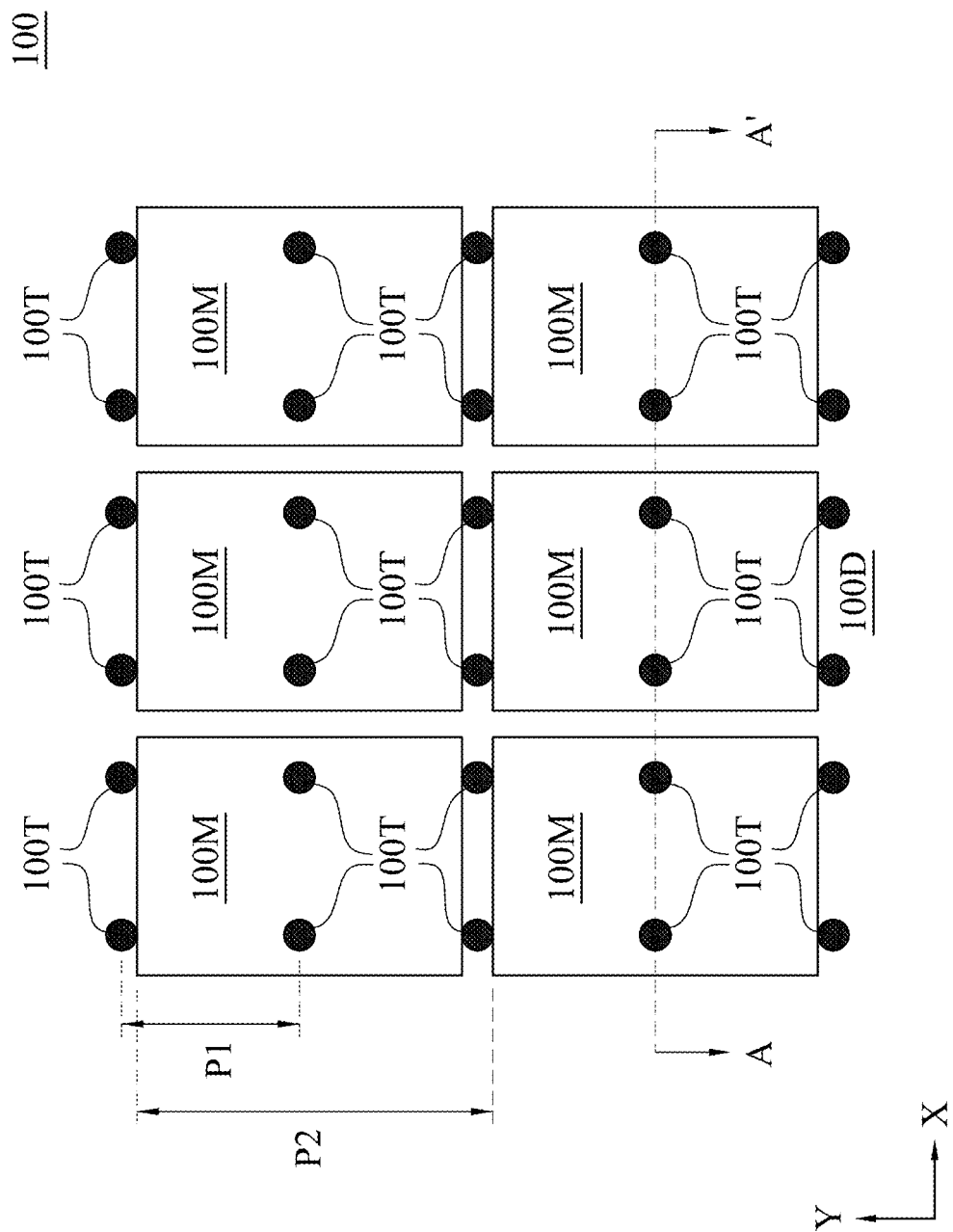
FIGS. 1A and 1B are diagrams of a memory macro structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory macro structure includes a TSV extending through the memory macro and spanning front and back sides of a memory die that includes the memory macro. A power distribution structure of an IC package including the memory die positioned between a logic die and a substrate is thereby capable of including TSVs that extend both between and through memory macros. Compared to approaches that do not include a TSV extending through a memory macro, TSV density is increased such that resistance and power losses in the power distribution structure are decreased for a given memory macro size.

Figure 1B:
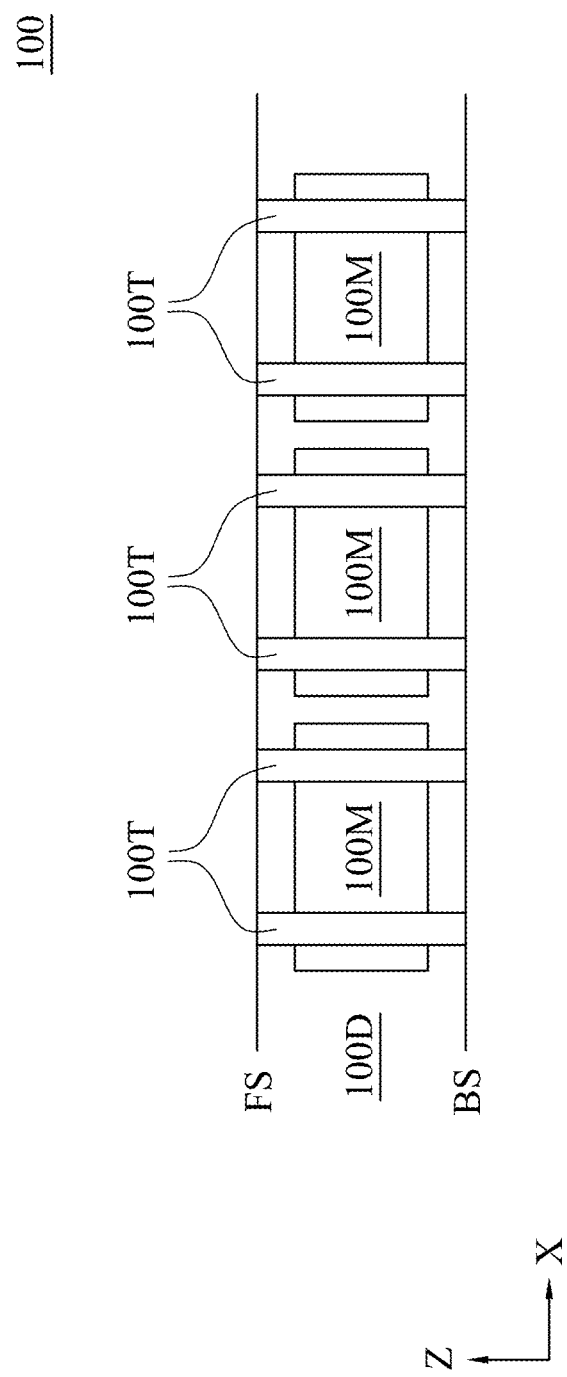

FIGS. 1A and 1B are diagrams of a memory macro structure 100, in accordance with some embodiments. FIG. 1A depicts a plan view including X and Y directions, and FIG. 1B depicts a cross-sectional view along a plane A-A' that includes the X direction and a Z direction.

Memory macro structure 100 includes multiple instances of memory macros 100M and TSVs 100T; each instance of TSV 100T spans a front side FS and a back side BS of an IC die 100D, also referred to as memory die 100D in some embodiments. In the embodiment depicted in FIGS. 1A and 1B, each instance of memory macro 100M includes two instances of TSV 100T extending through, and electrically isolated from, the instance of memory macro 100M, as discussed below. Memory macro structure 100M and IC die 100D are usable as components of an IC package, e.g., an IC package 400 discussed below with respect to FIG. 4.

The numbers, locations, and relative sizes of memory macros 100M and TSVs 100T depicted in FIGS. 1A and 1B are non-limiting examples provided for the purpose of illustration. In various embodiments, memory macro structure 100 includes memory macros 100M and TSVs 100T having numbers, locations, and/or relative sizes other than those depicted in FIGS. 1A and 1B.

A memory macro, e.g., memory macro 100M, is a memory circuit including at least one array of memory cells configured to store data, and one or more circuits configured to control data input, output, and storage operations (details not depicted in FIGS. 1A and 1B). In some embodiments, memory cells of memory macro 100M include static random-access memory (SRAM) cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In various embodiments memory cells of memory macro 100M include dynamic random-access memory (DRAM) cells, read-only memory (ROM) cells, non-volatile memory (NVM) cells, or other memory cell types capable of storing data.

A TSV, e.g., TSV 100T, is a conductive structure that spans front and back sides of an IC die, e.g., front side FS and back side BS of IC die 100D, and is thereby configured to provide a low resistance path through the IC die. A TSV includes one or more conductive materials, e.g., copper, aluminum, tungsten, titanium, and/or other material(s) suitable for providing a low-resistance path between front and back sides of an IC die. By being configured to provide a low resistance path through the IC die, a TSV is capable of being included in a power distribution structure of an IC package, e.g., a power distribution structure 400PDS of IC package 400 discussed below with respect to FIG. 4.

An instance of memory macro 100M including one or more instances of TSV 100T extending through the memory macro 100M is also referred to as memory macro structure 100M. In some embodiments, one or more instances of memory macro structure 100M includes memory macro structure 200 discussed below with respect to FIGS. 2-3C.

In the embodiment depicted in FIGS. 1A and 1B, each instance of memory macro 100M includes two instances of TSV 100T extending through, and electrically isolated from, the instance of memory macro 100M. In various embodiments, a given instance of memory macro 100M includes zero, one, or greater than two instances of TSV 100T extending through, and electrically isolated from, the instance of memory macro 100M.

In the embodiment depicted in FIGS. 1A and 1B, memory macro structure 100, also referred to as memory die structure 100 in some embodiments, includes each of memory macros 100M and TSVs 100T arranged in rows along the X direction. The rows of TSVs 100T are positioned both within memory macros 100M of the rows of memory macros 100M and between adjacent rows of memory macros 100M. TSVs 100T are centered in memory macros 100M in the Y direction such that TSVs 100T have a pitch P1 in the Y direction. A pitch P2 in the Y direction of memory macros 100M is thereby twice as large as pitch P1.

For a given size of memory macro 100M, by including TSVs 100T having pitch P1 half as large as pitch P2, memory macro structure 100 includes TSVs 100T having a greater density than densities in approaches that do not include TSVs extending through memory macros. In some embodiments, memory macro structure 100 includes TSVs 100T otherwise arranged to include at least one TSV 100T extending through, and electrically isolated from, at least one memory macro 100M such that a density of TSVs 100T is greater than densities in approaches that do not include TSVs extending through memory macros.

In various embodiments, memory macro structure 100 includes TSVs 100T positioned other than centered in memory macros 100M in the Y direction and/or positioned between adjacent columns of memory macros 100M instead of and/or in addition to between adjacent rows of memory macros 100M. In various embodiments, memory macro structure 100 includes subsets of memory macros 100M, e.g., alternating rows and/or columns, in which a first subset includes one or more TSVs 100V and a second subset is free from including one or more TSVs 100T.

By including at least one TSV 100T extending through, and electrically isolated from, at least one memory macro 100M such that a density of TSVs 100T is greater than densities in approaches that do not include TSVs extending through memory macros, IC die 100D including the at least one memory macro 100M is capable of being included in an IC package, e.g., IC package 400 discussed below with respect to FIG. 4, in which resistance and power losses in the power distribution structure are decreased for a given memory macro size.

Figure 2:
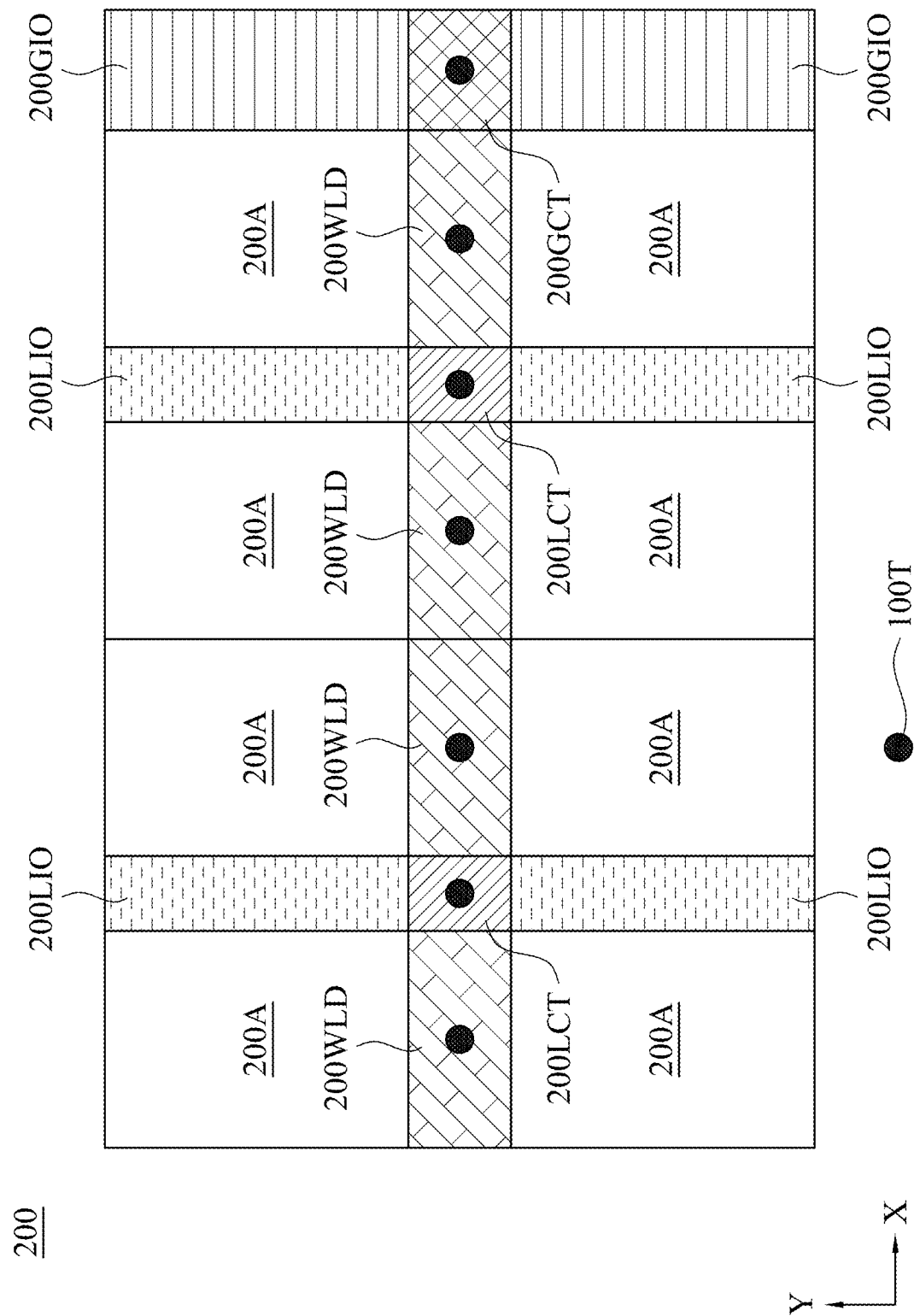
FIG. 2 is a diagram of a memory macro structure, in accordance with some embodiments.

FIG. 2 is a diagram of memory macro structure 200, in accordance with some embodiments. Memory macro structure 200 is usable as one or more instances of memory macro 100M discussed above with respect to FIGS. 1A and 1B. FIG. 2 depicts a plan view of memory macro structure 200 including the X and Y directions discussed above with respect to FIGS. 1A and 1B. Each of FIGS. 3A-3C discussed below is a diagram of a portion of memory macro structure 200, in accordance with some embodiments.

Memory macro structure 200 includes a global control circuit 200GCT, global input/output (I/O) circuits 200GIO, local control circuits 200LCT, local I/O circuits 200L10, cell activation circuits 200WLD, memory arrays 200A, and TSVs 100T discussed above with respect to FIGS. 1A and 1B.

Global control circuit 200GCT is positioned between and electrically coupled to global I/O circuits 200GIO, and electrically coupled to each instance of local control circuit 200LCT. Each instance of local control circuit 200LCT is positioned between and electrically coupled to two instances of local I/O circuit 200LIO, and positioned between and electrically coupled to two instances of cell activation circuit 200WLD, also referred to as word line driver 200WLD in some embodiments. Each instance of local I/O circuit 200LIO and each instance of activation circuit 200WLD is positioned between and electrically coupled to two instances of memory array 200A. In various embodiments, memory macro structure 200 includes combinations of one or more of address lines, bit lines, data lines, cell activation lines (also referred to as word lines in some embodiments), and/or signal lines (not shown in FIG. 2) whereby global control circuit 200GCT, global I/O circuits 200GIO, local control circuits 200LCT, local I/O circuits 200LIO, cell activation circuits 200WLD, and memory arrays 200A are electrically coupled to each other as discussed.

Memory arrays 200A are arrays of memory cells configured to store data as discussed above with respect to FIGS. 1A and 1B. Each of global control circuit 200GCT, global I/O circuits 200GIO, local control circuits 200LCT, local I/O circuits 200LIO, and activation circuits 200WLD is an IC configured to perform a subset of operations whereby data are input to, output from, and stored in corresponding instances of memory array 200A responsive to various combinations of address, clock, control, and/or data signals (not shown in FIG. 2).

Global control circuit 200GCT is configured to generate and receive one or more of the address, clock, control, and/or data signals configured to control top-level operation of memory macro structure 200; each instance of global [ROM/0 circuit 200G10 is configured to, responsive to one or more of the address, clock, control, and/or data signals, perform top-level I/O operations; each instance of local control circuit 200LCT is configured to, responsive to one or more of the address, clock, control, and/or data signals, control operation of adjacent instances of local I/O circuit 200L10 and cell activation circuit 200WLD, thereby controlling diagonally adjacent instances of memory array 200A; and each instance of local I/O circuit 200L10 and cell activation circuit 200WLD is configured to, responsive to one or more of the address, clock, control, and/or data signals, partially control operation of adjacent instances of memory array 200A.

In the embodiment depicted in FIG. 2, memory macro structure 200 includes a total of two instances of local control circuit 200LCT, each corresponding to four diagonally adjacent instances of memory array 200A. In various embodiments, memory macro structure 200 includes a total of one or more than two instances of local control circuit 200LCT, each corresponding to four diagonally adjacent instances of memory array 200A. In some embodiments, memory macro structure 200 includes at least one instance of local control circuit 200LCT corresponding to fewer or greater than four instances of memory array 200A.

In the embodiment depicted in FIG. 2, a single instance of TSV 100T extends through, and is electrically isolated from, each of global control circuit 200GCT, each instance of local control circuit 200LCT, and each instance of cell activation circuit 200WLD. In some embodiments, more than one instance of TSV 100T extends through, and is electrically isolated from, one or more of global control circuit 200GCT, each instance of local control circuit 200LCT, and each instance of cell activation circuit 200WLD. In some embodiments, one or more of global control circuit 200GCT, each instance of local control circuit 200LCT, and each instance of cell activation circuit 200WLD is free from including a TSV 100T.

In some embodiments, one or more instances of TSV 100T extends through, and is electrically isolated from, each of global control circuit 200GCT and each instance of local control circuit 200LCT; and each instance of cell activation circuit 200WLD is free from including a TSV 100T. In some embodiments, one or more instances of TSV 100T extends through, and is electrically isolated from, each instance of cell activation circuit 200WLD; and each of global control circuit 200GCT and each instance of local control circuit 200LCT is free from including a TSV 100T.

In various embodiments, one or more instances of TSV 100T (not shown) extends through, and is electrically isolated from, each of one or more instances of global I/O circuit 200GIO, local I/O circuit 200LIO, and/or memory array 200A.

Figure 3C:
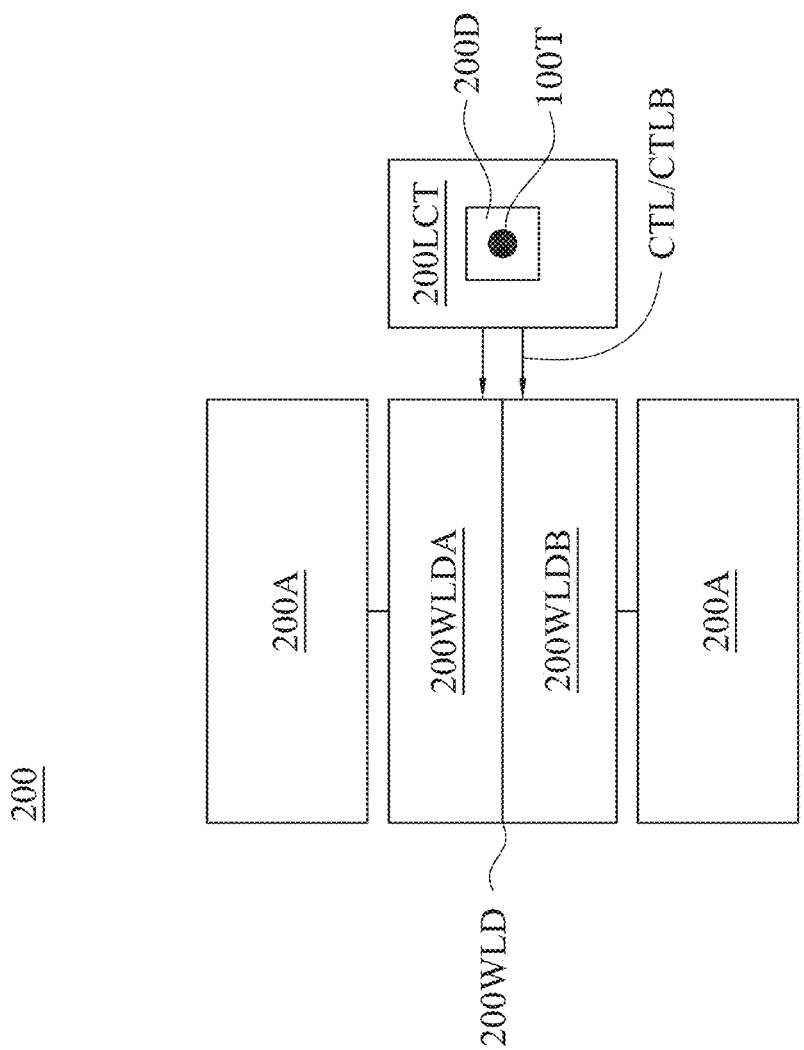

In each of the embodiments depicted in FIGS. 3A-3C, an instance of cell activation circuit 200WLD is adjacent to and electrically coupled to each of two instances of memory array 200A, and an instance of local control circuit 200LCT is adjacent to, e.g., in the positive or negative X direction, the instance of cell activation circuit 200WLD. Cell activation circuit 200WLD includes a portion 200WLDA electrically coupled to the first instance of memory array 200A and a portion 200WLDB electrically coupled to the second instance of memory array 200A.

In each of the embodiments depicted in FIGS. 3A and 3B, cell activation circuit 200WLD includes an instance of a dummy area 200D, and an instance of TSV 100T extends through the instance of dummy area 200D and is thereby electrically isolated from cell activation circuit 200WLD. In some embodiments, control circuit 200LCT includes an instance of dummy area 200D and an additional instance of TSV 100T extends through, and is electrically isolated from, control circuit 200LCT. In the embodiment depicted in FIG. 3C, control circuit 200LCT includes an instance of dummy area 200D, and an instance of TSV 100T extends through the instance of dummy area 200D and is thereby electrically isolated from control circuit 200LCT, and cell activation circuit 200WLD is free from including a TSV 100T.

In each of the embodiments depicted in FIGS. 3A and 3B, local control circuit 200LCT is coupled to portion 200WLDA through a signal bus CTLBA and separately coupled to portion 200WLDB through a signal bus CTLBB. Local control circuit 200LCT is thereby configured to separately communicate a first set of signals CTLA to portion 200WLDA through signal bus CTLBA and a second set of signals CTLB to portion 200WLDB through signal bus CTLBB.

In some embodiments, each of portions 200WLDA and 200WLDB includes an address decoder and each of first set of signals CTLA and second set of signals CTLB includes one or more sets of pre-decode signals.

In the embodiment depicted in FIG. 3C, local control circuit 200LCT is coupled to both of portions 200WLDA and 200WLDB through a single signal bus CTLB, and local control circuit 200LCT is thereby configured to communicate a set of signals CTL to both of portions 200WLDA and 200WLDB through signal bus CTLB. In some embodiments, each of portions 200WLDA and 200WLDB includes an address decoder and set of signals CTL includes one or more sets of pre-decode signals.

In the embodiment depicted in FIG. 3A, an instance of dummy area 200D extends across an entirety of cell activation circuit 200WLD such that portions 200WLDA and 200WLDB are separated by the instance of dummy area 200D. In the embodiment depicted in FIG. 3B, an instance of dummy area 200D extends across a portion of cell activation circuit 200WLD such that portions 200WLDA and 200WLDB share first and second borders (not labeled) separated by the instance of dummy area 200D.

In some embodiments, an instance of dummy area 200D extends across a portion of cell activation circuit 200WLD such that portions 200WLDA and 200WLDB share a single border (not labeled) adjacent to the instance of dummy area 200D. In some embodiments, cell activation circuit 200WLD includes one or more additional instances of dummy area 200D (not shown) such that portions 200WLDA and 200WLDB share one or more borders adjacent to each instance of dummy area 200D.

In the embodiments depicted in FIGS. 3A and 3B a single instance of TSV 100T extends through the instance of dummy area 200D in cell activation circuit 200WLD. In various embodiments, two or more instances of TSV 100T extend through the instance of dummy area 200D in cell activation circuit 200WLD or the instance of dummy area 200D in cell activation circuit 200WLD is free from including a TSV 100T.

By the configuration discussed above, memory macro structure 200 is capable of including at least one TSV 100T extending through, and electrically isolated from, the memory macro structure 200 such that an IC die including memory macro structure 200 is capable of realizing the benefits discussed above with respect to memory macro structure 100.

Figure 4:
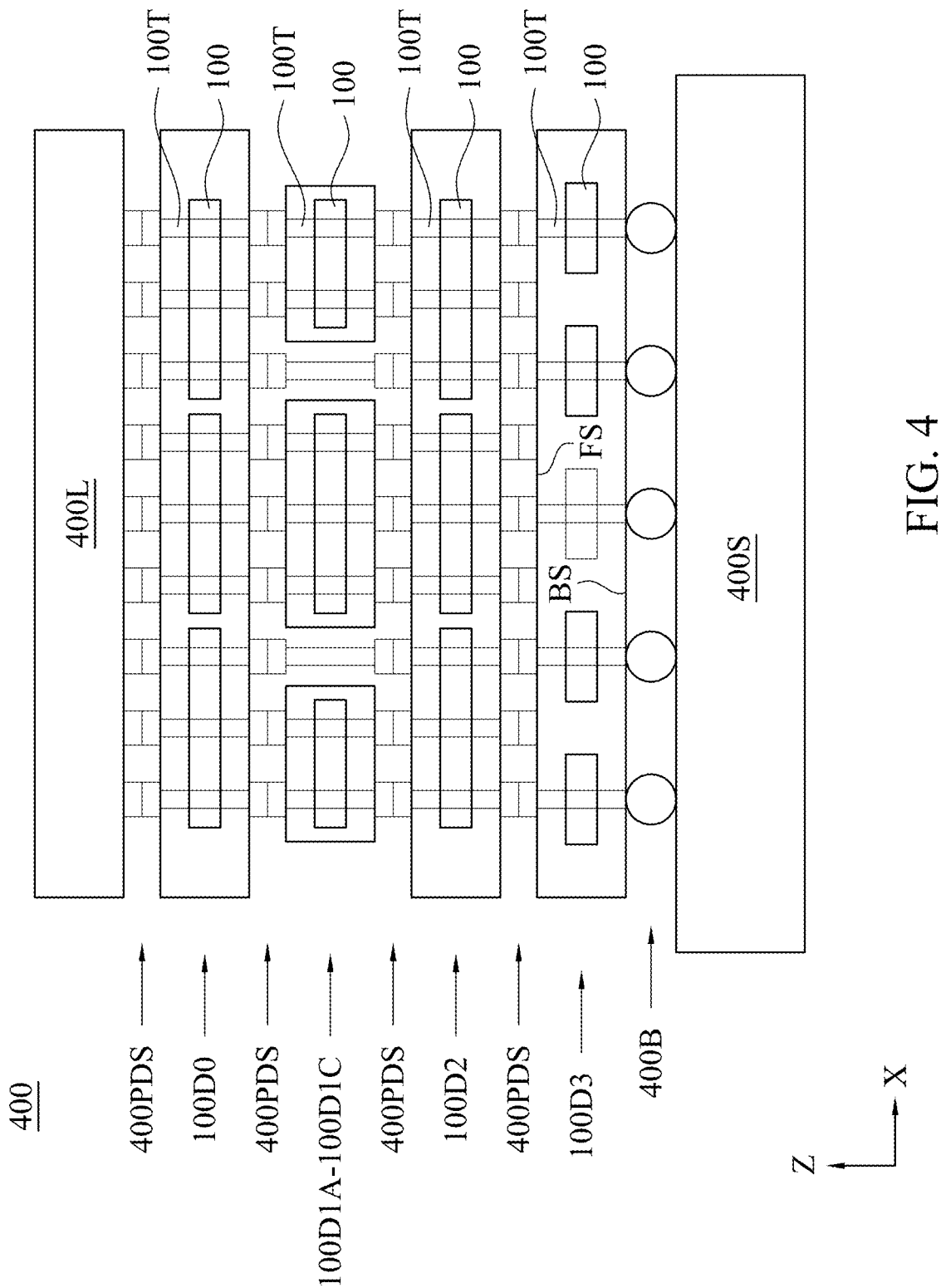
FIG. 4 is a diagram of an IC package, in accordance with some embodiments.

FIG. 4 is a diagram of IC package 400, in accordance with some embodiments. FIG. 4 depicts a cross-sectional view of IC package 400 including the X and Z directions discussed above with respect to FIGS. 1A and 1B. IC package 400 is a non-limiting example of an IC package including at least one instance of IC die 100D in which one or more instances of TSV 100T extend through one or more instances of memory macro 100M as discussed above with respect to FIGS. 1A-3C.

IC package 400 includes a logic die 400L, a substrate 400S, memory dies 100D0-100D3 positioned between logic die 400L and substrate 400S, and power distribution structure 400PDS. Each of memory dies 100D0-100D3 is an instance of IC die 100D including one or more instances of TSV 100T extending through one or more instances of memory macro 100M (representative instances labeled), each discussed above with respect to FIGS. 1A-3C. Power distribution structure 400PDS includes bump structures 400B and the instances of TSV 100T, and is thereby configured to electrically couple logic die 400L to substrate 400S.

Memory die 100D0 is adjacent to logic die 400L; memory dies 100D1A-100D1C are aligned along the X direction, and each of memory dies 100D1A-100D1C is adjacent to memory die 100D0; memory die 100D2 is adjacent to each of memory dies 100D1A-100D1C; and memory die 100D3 is adjacent to each of memory die 100D2 and substrate 400S. An instance of TSV 100T is positioned between memory dies 100D0, 100D1A, 100D1B, and 100D2, and an instance of TSV 100T is positioned between memory dies 100D0, 100D1B, 100D1C, and 100D2.

Logic die 400L, memory dies 100D0, 100D1A, 100D2, and 100D3, and substrate 400S are aligned along the Z direction; logic die 400L, memory dies 100D0, 100D1B, 100D2, and 100D3, and substrate 400S are aligned along the Z direction; and logic die 400L, memory dies 100DO, 100D1C, 100D2, and 100D3, and substrate 400S are aligned along the Z direction.

Logic die 400L is an IC chip including one or more IC devices, e.g., one or a combination of a logic circuit, a signal circuit, or application processor, a system on an IC (SoIC), a transmitter and/or receiver, an application-specific IC (ASIC), a large-scale integration (LSI) or very large-scale integration (VLSI) circuit, a voltage or current regulator, or the like.

Substrate 400S is an IC chip or printed circuit board including conductive segments supported and electrically separated by a plurality of insulation layers and configured to receive one or more power supply voltages and a reference, e.g., ground, voltage, and distribute the one or more power supply voltages and reference voltage to one or more of bump structures 400B.

Conductive segments include conductive lines, vias, contact pads, and/or under-bump metallization (UBM) structures including one or more conductive materials, e.g., a metal such as copper, aluminum, tungsten, or titanium, polysilicon, or another material capable of providing a low resistance path. Insulation layers include one or more dielectric materials, e.g., silicon dioxide, silicon nitride, or one or more high-k dielectric materials, molding compounds, or other materials capable of electrically insulating adjacent conductive segments from each other.

Power distribution structure 400PDS, also referred to as power distribution network 400PDS in some embodiments, includes a plurality of conductive segments supported and electrically separated by a plurality of insulation layers and arranged in accordance with power delivery requirements, e.g., of logic die 400L. In various embodiments, power distribution structure 400PDS includes one or a combination of a TSV, e.g., TSV 100T, a through-dielectric via (TDV), a power rail, a super power rail, a buried power rail, a contact pad, conductive segments arranged in a grid or mesh structure, or another arrangement suitable for distributing power to one or more IC devices.

The plurality of conductive segments are arranged so as to contact logic die 400L and some or all of the instances of TSV 100T included in some or all of memory dies 100D0-100D3 such that power distribution structure 400PDS is configured to electrically couple logic die 400L to substrate 400S through the some or all of the instances of TSV 100T and bump structures 400B.

Bump structures 400B are conductive structures that overlie and contact portions of substrate 400S, thereby being configured to provide electrical connections between substrate 400S and some or all of the instances of TSV 100T included in memory die 100D3. In some embodiments, bump structures 400B include lead. In some embodiments, bump structures 400B include lead-free materials such as tin, nickel, gold, silver, copper, or other materials suitable for providing electrical connections to external conductive elements.

In some embodiments, bump structures 400B have substantially spherical shapes. In some embodiments, bump structures 400B are controlled collapse chip connection (C4) bumps, ball grid array bumps, microbumps or the like.

In the non-limiting example depicted in FIG. 4, IC package 400 includes six instances of memory die 100D, memory dies 100D0-100D3, arranged in four rows positioned between logic die 400L and substrate 400S so as to electrically couple logic die 400L to substrate 400S. In various embodiments, IC package includes greater or fewer than six instances of memory die 100D and/or includes instances of memory die 100D otherwise arranged so as to electrically couple logic die 400L to substrate 400S. In some embodiments, IC package 400 includes a single instance of memory die 100D positioned between logic die 400L and substrate 400S so as to electrically couple logic die 400L to substrate 400S.

In the non-limiting example depicted in FIG. 4, IC package 400 includes memory dies 100D0-100D3 oriented with front side FS further along the Z direction than back side BS (representative instance of memory die 100D3 labeled). In various embodiments, one or more of memory dies 100D0-100D3 has an opposite orientation of back side BS further along the Z direction than front side FS.

In the non-limiting example depicted in FIG. 4, IC package 400 includes single instances of each of logic die 400L and substrate 400S. In various embodiments, IC package 400 includes two or more instances of one or both of logic die 400L or substrate 400S, and the instances of memory die 100D are arranged so as to electrically couple each instance of logic die 400L to each instance of substrate 400S.

In the non-limiting example depicted in FIG. 4, memory dies 100D0-100D3 include a number of instances of memory macro 100M ranging from one to five. In various embodiments, one or more of memory dies 100D0-100D3 is free from including an instance of memory macro 100M or includes a number of instances of memory macro 100M greater than five.

In the non-limiting example depicted in FIG. 4, the instances of memory macro 100M include a number of instances of TSV 100T ranging from one to three. In various embodiments, one or more instances of memory macro 100M includes a number of instances of TSV 100T greater than three.

By the configuration discussed above, IC package 400 includes at least one instance of IC die 100D in which one or more instances of TSV 100T extend through one or more instances of memory macro 100M such that IC package 400 is capable of realizing the benefits discussed above with respect to memory macro 100.

Figure 5:
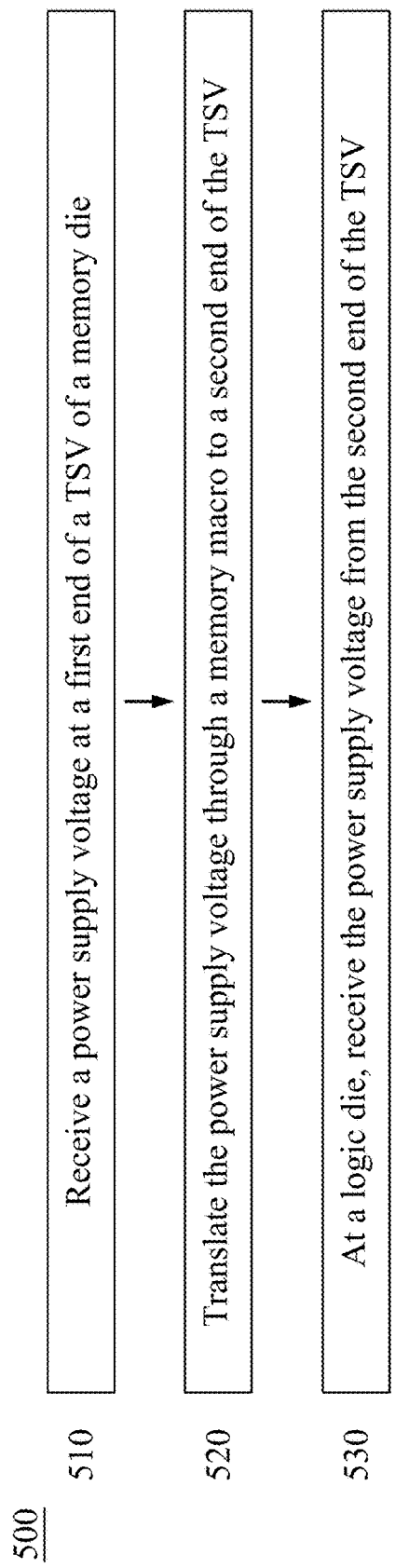
FIG. 5 is a flowchart of a method of operating an IC package, in accordance with some embodiments.

FIG. 5 is a flowchart of a method 500 of operating an IC package, in accordance with one or more embodiments. Method 500 is usable with an IC package, e.g., IC package 400 discussed above with respect to FIG. 4.

The sequence in which the operations of method 500 are depicted in FIG. 5 is for illustration only; the operations of method 500 are capable of being executed in sequences that differ from that depicted in FIG. 5. In some embodiments, operations in addition to those depicted in FIG. 5 are performed before, between, during, and/or after the operations depicted in FIG. 5. In some embodiments, the operations of method 500 are part of operating a circuit, e.g., a circuit that includes an IC package.

At operation 510, in some embodiments, a power supply voltage is received at a first end of a TSV of a memory die. Receiving the power supply voltage at the first end of the TSV of the memory die includes the memory die being positioned in an IC package, and receiving the power supply voltage at the first end of the TSV of the memory die includes receiving the power supply voltage from a power distribution structure of the IC package. In some embodiments, receiving the power supply voltage at the first end of the TSV of the memory die includes receiving the power supply voltage from power distribution structure 400PDS discussed above with respect to FIG. 4. In some embodiments, receiving the power supply voltage from the power distribution structure includes receiving the power supply voltage from a bump structure, e.g., a bump structure 400B discussed above with respect to FIG. 4.

In some embodiments, the memory die is positioned between a logic die and a substrate configured to receive the power supply voltage, and receiving the power supply voltage at the first end of the TSV of the memory die includes receiving the power supply voltage at the substrate. In some embodiments, receiving the power supply voltage at the substrate includes receiving the power supply voltage at substrate 400S of IC package 400 discussed above with respect to FIG. 4.

In some embodiments, receiving the power supply voltage at the first end of the TSV of the memory die includes receiving the power supply voltage at an end of TSV 100T of memory die 100D discussed above with respect to FIGS. 1A-4.

In some embodiments, the TSV is one TSV of a plurality of TSVs, and receiving the power supply voltage at the first end of the TSV includes receiving the power supply voltage at each TSV of the plurality of TSVs, e.g., multiple instances of TSV 100T discussed above with respect to FIGS. 1A-4.

In some embodiments, the memory die is one memory die of a plurality of memory dies, and receiving the power supply voltage at the first end of the TSV of the memory die includes receiving the power supply voltage translated through one or more additional memory dies of the plurality of memory dies.

In some embodiments, receiving the power supply voltage at the first end of the TSV of the memory die includes receiving a reference, e.g., ground voltage.

At operation 520, the power supply voltage is translated through a memory macro to a second end of the TSV. Translating the power supply voltage through the memory macro includes translating the power supply voltage electrically isolated from the memory macro. In some embodiments, translating the power supply voltage through the memory macro includes translating the power supply voltage through memory macro 100 discussed above with respect to FIGS. 1A-4.

In some embodiments, translating the power supply voltage through the memory macro includes translating the power supply voltage through a control circuit or cell activation circuit of the memory macro, e.g., global control circuit 200GCT, local control circuit 200LCT, or cell activation circuit 200WLD discussed above with respect to FIGS. 2-3C.

In some embodiments, the TSV is one TSV of a plurality of TSVs included in the memory macro, and translating the power supply voltage through the memory macro includes translating the power supply voltage to second ends of each TSV of the plurality of TSVs, e.g., multiple instances of TSV 100T discussed above with respect to FIGS. 1A-4.

In some embodiments, the memory macro is one memory macro of a plurality of memory macros, and translating the power supply voltage through the memory macro includes translating the power supply voltage through each memory macro of the plurality of memory macros, e.g., multiple instances of memory macro 100M discussed above with respect to FIGS. 1A-4.

In some embodiments, translating the power supply voltage through the memory macro includes translating the reference voltage through the memory macro.

At operation 530, the power supply voltage is received at the logic die from the second end of the TSV. Receiving the power supply voltage at the logic die includes receiving the power supply voltage from the power distribution structure of the IC package, e.g., power distribution structure 400PDS of IC package 400 discussed above with respect to FIG. 4.

In some embodiments, the memory die is one memory die of a plurality of memory dies, and receiving the power supply voltage from the second end of the TSV includes receiving the power supply voltage translated through one or more additional memory dies of the plurality of memory dies.

In some embodiments, the TSV is one TSV of a plurality of TSVs, and receiving the power supply voltage from the second end of the TSV includes receiving the power supply voltage from the second end of each TSV of the plurality of TSVs, e.g., multiple instances of TSV 100T discussed above with respect to FIGS. 1A-4.

In some embodiments, receiving the power supply voltage from the second end of the TSV includes receiving the reference voltage from the second end of the TSV.

By executing some or all of the operations of method 500, IC package operation includes translating a power supply voltage through a memory macro including a TSV, thereby obtaining the benefits discussed above with respect to memory macro structure 100.

Figure 6:
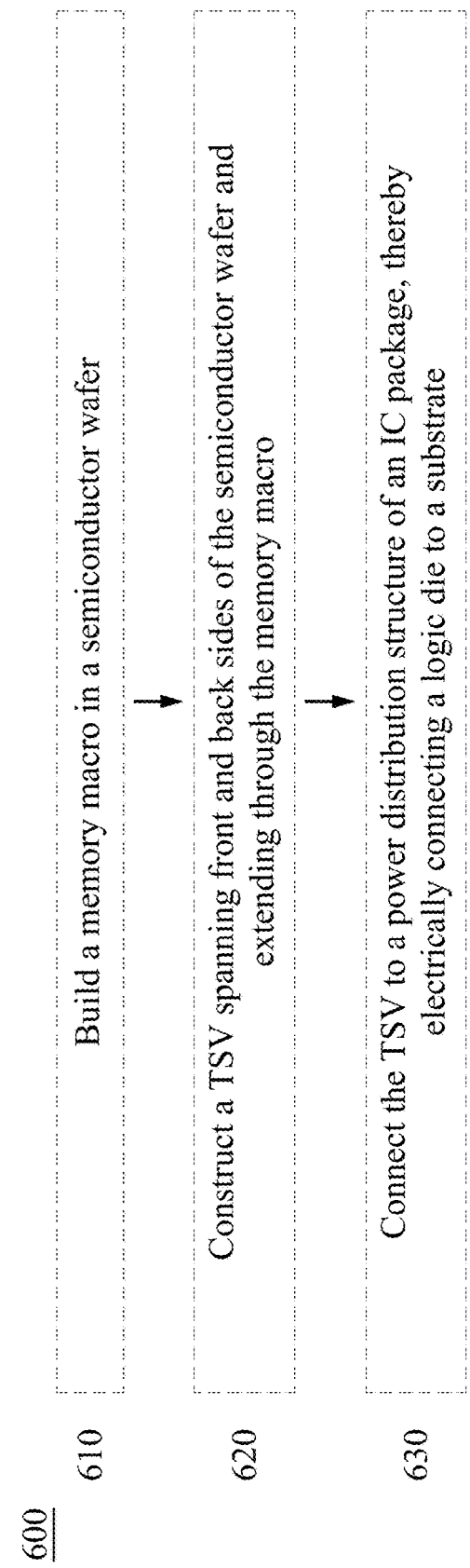
FIG. 6 is a flowchart of a method of manufacturing a memory macro structure, in accordance with some embodiments.

FIG. 6 is a flowchart of a method 600 of manufacturing a memory macro structure, in accordance with some embodiments. Method 600 is operable to form memory macro structure 100 discussed above with respect to FIGS. 1A and 1B and/or IC package 400 discussed above with respect to FIG. 4. In some embodiments, operations of method 600 are a subset of operations of a method of forming an IC package, e.g., a 2.5D IC package, a 3D IC package, or an InFO package.

In some embodiments, the operations of method 600 are performed in the order depicted in FIG. 6. In some embodiments, the operations of method 600 are performed in an order other than the order depicted in FIG. 6. In some embodiments, one or more additional operations are performed before, during, and/or after the operations of method 600. In some embodiments, performing some or all of the operations of method 600 includes performing one or more operations as discussed below with respect to IC manufacturing system 1000 and FIG. 10.

At operation 610, in some embodiments, a memory macro is built in a semiconductor wafer. In some embodiments, building the memory macro includes building memory macro 100M die 100D discussed above with respect to FIGS. 1A-4.

Building the memory macro includes building a plurality of IC devices, e.g., transistors, logic gates, memory cells, interconnect structures, and/or other suitable devices, configured to operate as discussed above with respect to memory macro 100M.

Building the memory macro includes performing a plurality of manufacturing operations, e.g., one or more of a lithography, diffusion, deposition, etching, planarizing, or other operation suitable for building the plurality of IC devices in the semiconductor wafer.

In some embodiments, building the memory macro includes building the memory macro including a dummy area, e.g., dummy area 200D discussed above with respect to FIGS. 3A-3C. Building the memory macro including the dummy area includes forming one or more dielectric layers, thereby configuring the dummy area to be electrically isolated from the memory macro, e.g., electrically isolated from global control circuit 200GCT, local control circuit 200LCT, or cell activation circuit 200WLD discussed above with respect to FIGS. 2-3C.

Forming one or more dielectric layers includes depositing one or more dielectric materials, e.g., silicon dioxide, silicon nitride, or one or more high-k dielectric materials, or other materials capable of electrically insulating adjacent conductive segments from each other. In various embodiments, depositing a dielectric material includes performing a physical vapor deposition (PVD) or chemical vapor deposition (CVD) process, a laser chemical vapor deposition (LCVD) process, an evaporation process, an electron beam evaporation (E-gun) process, or another suitable deposition process.

In some embodiments, operation 620 is performed prior to performing operation 610, and building the memory macro includes forming the dummy area adjacent to one or more TSVs extending through the memory macro structure.

In some embodiments, building the memory macro in the semiconductor wafer includes building a plurality of memory macros, e.g., multiple instances of memory macro 100M discussed above with respect to FIGS. 1A-4, in the semiconductor wafer.

In some embodiments, operation 610 is repeated such that building the memory macro in the semiconductor wafer includes building a plurality of memory macros in a corresponding plurality of semiconductor wafers, e.g., corresponding to memory dies 100D0-100D3 discussed above with respect to FIG. 4.

At operation 620, in some embodiments, a TSV spanning front and back sides of the semiconductor wafer and extending through the memory macro is constructed. Constructing the TSV includes performing a plurality of manufacturing operations including depositing and patterning one or more photoresist layers, performing one or more etching processes, and performing one or more deposition processes whereby one or more conductive materials are configured to form a continuous, low resistance structure spanning the front and back sides of the semiconductor wafer.

In some embodiments, constructing the TSV spanning the front and back sides of the semiconductor wafer and extending through the memory macro includes constructing TSV 100T spanning front side FS and back side BS of IC die 100D and extending through memory macro 100M discussed above with respect to FIGS. 1A-4.

In some embodiments, constructing the TSV extending through the memory macro includes constructing the TSV extending through a dummy area of the memory macro, e.g., dummy area 200D discussed above with respect to FIGS. 3A-3C.

In some embodiments, operation 620 is performed prior to performing operation 610, and constructing the TSV extending through the memory macro includes constructing the TSV extending through one or more dielectric layers of the semiconductor wafer, the one or more dielectric layers corresponding to the memory macro. In some embodiments, portions of each of operations are performed iteratively, whereby the TSV spanning front and back sides of the semiconductor wafer and extending through the memory macro is constructed.

In some embodiments, constructing the TSV spanning front and back sides of the semiconductor wafer and extending through the memory macro includes constructing a plurality of TSVs, e.g., multiple instances of TSV 100T discussed above with respect to FIGS. 1A-4.

In some embodiments, operation 610 is repeated such that constructing the TSV spanning front and back sides of the semiconductor wafer and extending through the memory macro includes constructing a plurality of TSVs spanning front and back sides of a corresponding plurality of semiconductor wafers and extending through corresponding memory macros, e.g., multiple instances of TSV 100T corresponding to memory dies 100D0-100D3 discussed above with respect to FIG. 4.

At operation 630, in some embodiments, the TSV is connected to a power distribution structure of an IC package, thereby electrically connecting a logic die to a substrate. Connecting the TSV to the power distribution structure of the IC package includes performing one or more IC package manufacturing operations whereby a portion or all of the semiconductor wafer including the TSV extending through the memory macro is connected to the power distribution structure of the IC package.

In various embodiments, the one or more IC package manufacturing operations include one or more of a die separation process, a molding injection or deposition, a bonding process, a metal deposition process, a solder process, an annealing process, or another process suitable for manufacturing an IC package.

In some embodiments, connecting the TSV to the power distribution structure of the IC package includes connecting an instance of TSV 100T to power distribution structure 400PDS discussed above with respect to FIG. 4.

In some embodiments, the TSV is one TSV of a plurality of TSVs, and connecting the TSV to the power distribution structure of the IC package includes connecting each TSV of the plurality of TSVs the power distribution structure of the IC package, e.g., connecting multiple instances of TSV 100T to power distribution structure 400PDS discussed above with respect to FIG. 4.

In some embodiments, operation 630 is repeated such that TSVs of a plurality of semiconductor wafers are connected to the power distribution structure, e.g., connecting TSVs of one or more of IC dies 100D0-100D3 to power distribution structure 400PDS discussed above with respect to FIG. 4.

The operations of method 600 are capable of being performed as a whole or as separate subsets of operations. For example, by performing some or all of operations 610 and 620, a memory macro structure including a TSV extending through, and electrically isolated from, the memory macro is formed, thereby obtaining the benefits discussed above with respect to memory macro structure 100. By performing some or all of operation 630 based on a memory macro structure formed in accordance with operations 610 and 620, an IC package is formed in which the memory macro structure includes a TSV extending through, and electrically isolated from, the memory macro, thereby obtaining the benefits discussed above with respect to memory macro structure 100 and the with respect to IC package 400.

Figure 7:
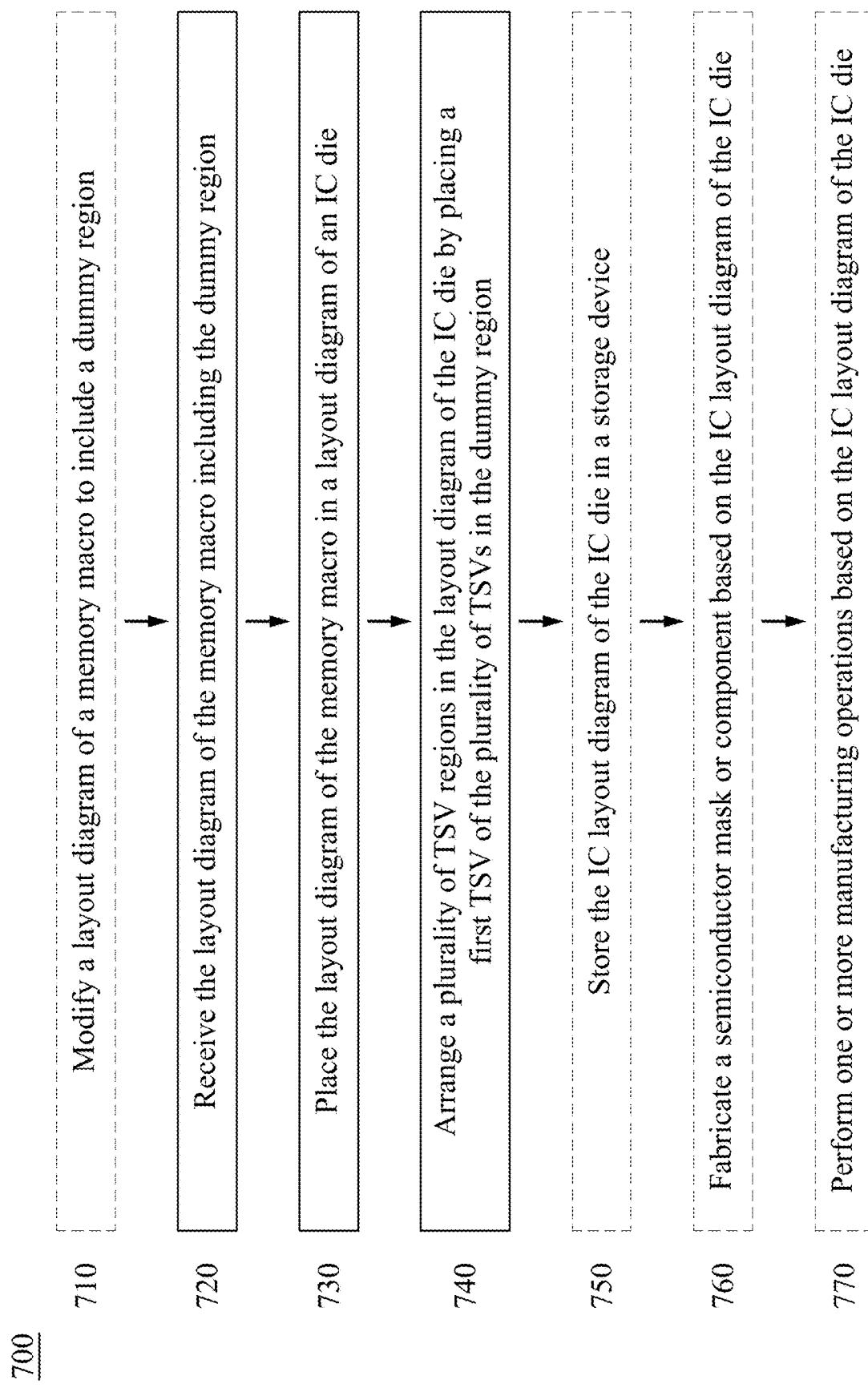
FIG. 7 is a flowchart of a method of generating an IC layout diagram, in accordance with some embodiments.

FIG. 7 is a flowchart of a method 700 of generating an IC layout diagram, in accordance with some embodiments. In some embodiments, generating the IC layout diagram includes generating an IC layout diagram, e.g., an IC layout diagram 800A-800C discussed below with respect to FIGS. 8A-8C, corresponding to a memory macro structure, e.g., memory macro structure 100 discussed above with respect to FIGS. 1A-4, manufactured based on the generated IC layout diagram.

In some embodiments, some or all of method 700 is executed by a processor of a computer. In some embodiments, some or all of method 700 is executed by a processor 902 of an IC layout diagram generation system 900, discussed below with respect to FIG. 9.

Some or all of the operations of method 700 are capable of being performed as part of a design procedure performed in a design house, e.g., a design house 1020 discussed below with respect to FIG. 10.

In some embodiments, the operations of method 700 are performed in the order depicted in FIG. 7. In some embodiments, the operations of method 700 are performed simultaneously and/or in an order other than the order depicted in FIG. 7. In some embodiments, one or more operations are performed before, between, during, and/or after performing one or more operations of method 700.

Figure 8A:
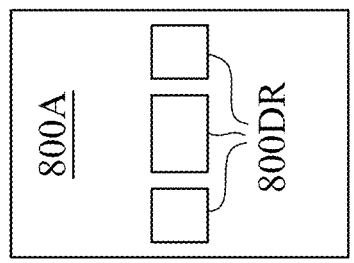
FIGS. 8A-8C are IC layout diagrams, in accordance with some embodiments.
Figure 8C:
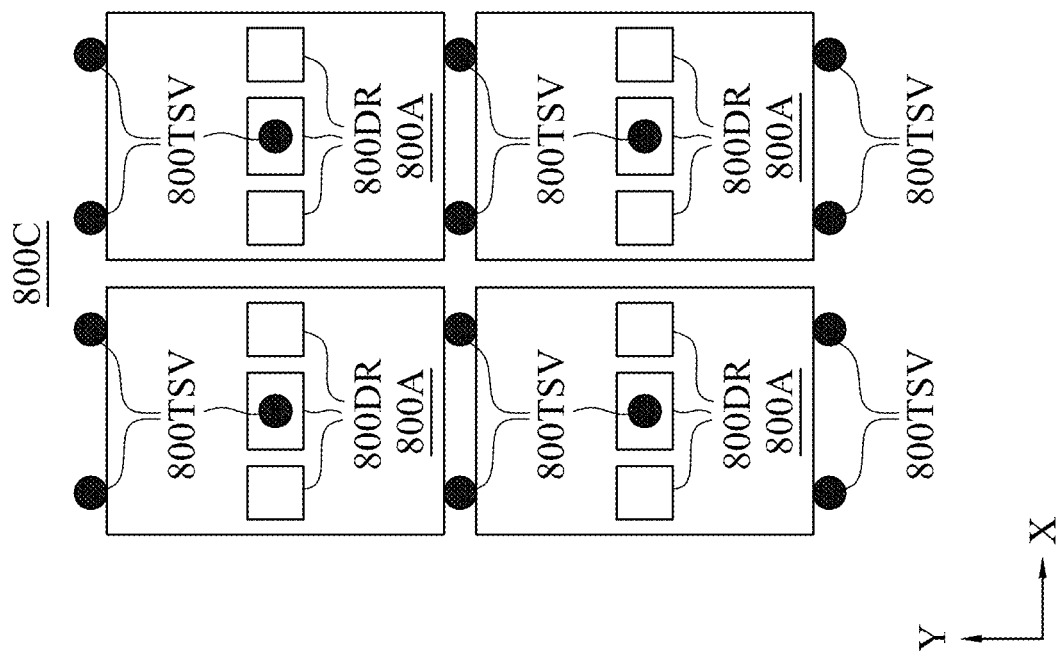
Figure 8B:
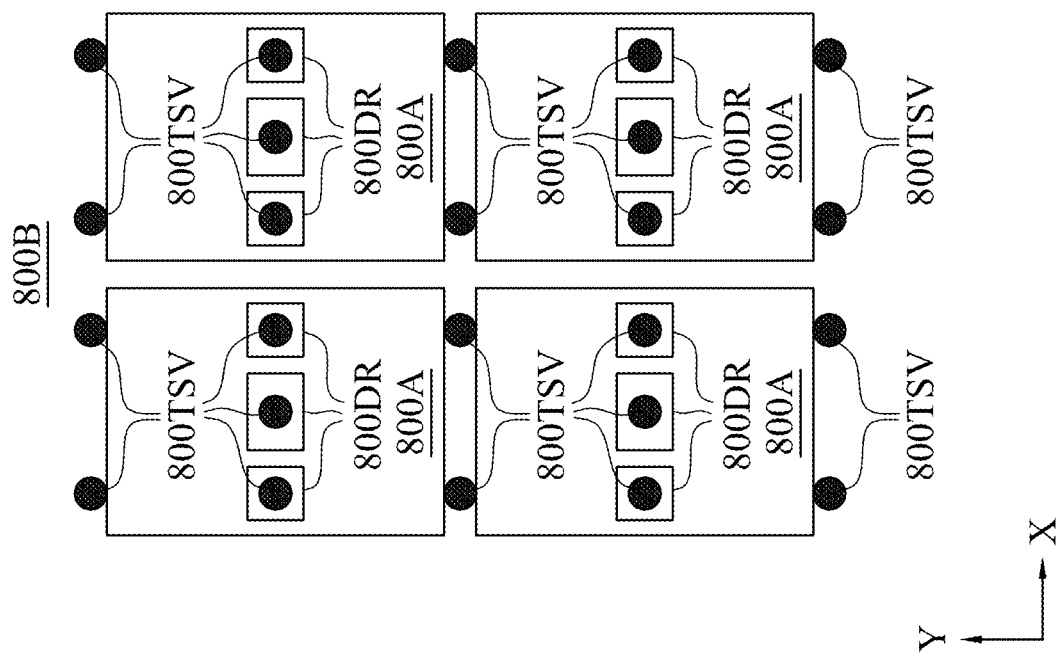

FIGS. 8A-8C depict non-limiting examples of respective IC layout diagrams 800A-800C generated by executing one or more operations of method 700 as discussed below, in some embodiments. Each of IC layout diagrams 800A-800C is simplified for the purpose of illustration. In various embodiments, one or more of IC layout diagrams 800A-800C includes features in addition to those depicted in FIGS. 8A-8C, e.g., one or more transistor elements, vias, contacts, isolation structures, wells, conductive elements, or the like. In addition to respective IC layout diagrams 800A-800C, each of FIGS. 8A-8C depicts the X and Y directions discussed above with respect to FIGS. 1A-4.

At operation 710, in some embodiments, a layout diagram of a memory macro is modified to include a dummy region. Modifying the layout diagram of the memory macro to include the dummy region includes the dummy region being usable in a manufacturing process as part of defining a dummy area in a memory macro manufactured based on the layout diagram of the memory macro. In some embodiments, modifying the layout diagram of the memory macro to include the dummy region includes modifying memory macro 100M discussed above with respect to FIGS. 1A-4.

In some embodiments, modifying the layout diagram of the memory macro to include the dummy region includes locating the dummy region in a control circuit region or a cell activation circuit region of the memory macro. In some embodiments, modifying the layout diagram of the memory macro to include the dummy region includes the dummy region being usable as part of defining an instance of dummy area 200D discussed above with respect to FIGS. 2-3C.

In some embodiments, modifying the layout diagram of the memory macro to include the dummy region includes modifying the layout diagram of the memory macro to include a plurality of dummy regions. In some embodiments, modifying the layout diagram of the memory macro to include the dummy region includes modifying IC layout diagram 800A to include dummy regions 800DR as depicted in FIGS. 8A-8C. IC layout diagram 800A corresponds to memory macro 100M and each of dummy regions 800DR corresponds to an instance of dummy region 200D discussed above with respect to FIGS. 1A-4.

In some embodiments, modifying the layout diagram of the memory macro includes receiving the memory macro from a storage device, e.g., a non-transitory, computer-readable storage medium 904 discussed below with respect to FIG. 9. In some embodiments, modifying the layout diagram of the memory macro includes receiving the memory macro through a network interface, e.g., a network interface 912 discussed below with respect to FIG. 9.

In some embodiments, modifying the layout diagram of the memory macro includes the memory macro being included in an intellectual property (IP) block. In some embodiments, modifying the layout diagram of the memory macro includes receiving the IP block, e.g., in the form of one or more electronic files transmitted over a network.

In some embodiments, modifying the layout diagram of the memory macro includes storing the memory macro in the storage device and/or transmitting the memory macro through the network interface.

At operation 720, the layout diagram of the memory macro including the dummy region is received. In some embodiments, receiving the layout diagram of the memory macro includes receiving the layout diagram at an IC layout diagram generation system, e.g., IC layout diagram generation system 900 discussed below with respect to FIG. 9.

In some embodiments, receiving the layout diagram of the memory macro includes receiving IC layout diagram 800A.

In some embodiments, receiving the layout diagram of the memory macro includes receiving a plurality of layout diagrams of memory macros. In various embodiments, receiving the plurality of layout diagrams of memory macros includes the layout diagrams being the same or varying layout diagrams.

At operation 730, the layout diagram of the memory macro is placed in a layout diagram of an IC die. In some embodiments, placing the layout diagram of the memory macro in the layout diagram of the IC die includes the layout diagram of the IC die corresponding to IC die 100D discussed above with respect to FIGS. 1A-4.

In some embodiments, the layout diagram is one layout diagram of a plurality of layout diagrams of memory macros, and placing the layout diagram of the memory macro in the layout diagram of the IC die includes placing the plurality of layout diagrams of memory macros in the layout diagram of the IC die. In some embodiments, placing the plurality of layout diagrams of memory macros in the layout diagram of the IC die includes arranging the plurality of layout diagrams of memory macros in rows and/or columns.

In some embodiments, placing the layout diagram of the memory macro in the layout diagram of the IC die includes placing IC layout diagram 800A in one of IC layout diagram 800B depicted in FIG. 8B or IC layout diagram 800C depicted in FIG. 8C.

At operation 740, a plurality of TSV regions is arranged in the layout diagram of the IC die by placing a first TSV region of the plurality of TSV regions in the dummy region. In some embodiments, placing the first TSV region of the plurality of TSV regions in the dummy region includes placing the first TSV region corresponding to an instance of TSV 100T discussed above with respect to FIGS. 1A-4.

In some embodiments, the dummy region is a first dummy region of a plurality of dummy regions of the memory macro, and arranging the plurality of TSV regions in the layout diagram of the IC die includes placing a second TSV region of the plurality of TSV regions in a second dummy region of the plurality of dummy regions.

In some embodiments, the layout diagram of the memory macro is one layout diagram of a plurality of layout diagrams of memory macros, and arranging the plurality of TSV regions in the layout diagram of the IC die includes placing a TSV region of the plurality of TSV regions in each dummy region of a corresponding memory macro of the plurality of layout diagrams of memory macros.

In some embodiments, the layout diagram of the memory macro is one layout diagram of a plurality of layout diagrams of memory macros arranged in rows, and arranging the plurality of TSV regions in the layout diagram of the IC die includes placing a subset of the plurality of TSV regions between adjacent rows of the plurality of layout diagrams of memory macros.

In some embodiments, arranging the plurality of TSV regions in the layout diagram of the IC die includes arranging TSV regions 800TSV in one of IC layout diagram 800B depicted in FIG. 8B or IC layout diagram 800C depicted in FIG. 8C. Each of TSV regions 800TSV is a region in an IC layout diagram usable in the manufacturing process as part of defining a TSV, e.g., TSV 100T discussed above with respect to FIGS. 1A-4.

In the non-limiting example depicted in FIG. 8B, arranging TSV regions 800TSV includes placing an instance of TSV region 800TSV in each instance of dummy region 800DR of each instance of IC layout diagram 800A. In the non-limiting example depicted in FIG. 8C, arranging TSV regions 800TSV includes placing an instance of TSV region 800TSV in a single instance of dummy region 800DR of each instance of IC layout diagram 800A. In various embodiments, arranging TSV regions 800TSV includes otherwise placing instances of TSV region 800TSV in instances of dummy region 800DR of instances of IC layout diagram 800A, e.g., placing varying numbers of instances of TSV regions in instances of dummy region 800DR for a given instance of IC layout diagram 800A.

In some embodiments, arranging the plurality of TSV regions in the layout diagram of the IC die is based on one or more design criteria of a logic die, e.g., logic die 400L discussed above with respect to FIG. 4. In some embodiments, the one or more design criteria include power supply voltage drops based on resistance values of a plurality of TSVs corresponding to the plurality of TSV regions.

At operation 750, in some embodiments, the IC layout diagram is generated and stored in a storage device. Generating the IC layout diagram is performed by a processor, e.g., processor 902 of IC layout diagram generation system 900 discussed below with respect to FIG. 9.

In some embodiments, generating the IC layout diagram includes positioning one or more features (not shown), e.g., a contact, via, or conductive region, corresponding to one or more IC structures manufactured based on the one or more features and configured to provide electrical connections to one or more memory macros corresponding to the memory macro including the dummy region.

In various embodiments, storing the IC layout diagram in the storage device includes storing the IC layout diagram in a non-volatile, computer-readable memory, e.g., a database, and/or includes storing the IC layout diagram over a network. In various embodiments, storing the IC layout diagram in the storage device includes storing the IC layout diagram in non-volatile, computer-readable memory 904 and/or over network 914 of IC layout diagram generation system 900, discussed below with respect to FIG. 9.

In various embodiments, generating and storing the IC layout diagram includes generating and storing one or more of IC layout diagrams 800A-800C.

At operation 760, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to IC manufacturing system 1000 and FIG. 10.

In various embodiments, fabricating one or more semiconductor masks or at least one component in the layer of the semiconductor IC is based on one or more of IC layout diagrams 800A-800C.

At operation 770, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 10.

In various embodiments, performing one or more manufacturing operations is based on one or more of IC layout diagrams 800A-800C.

By executing some or all of the operations of method 700, an IC layout diagram, e.g., IC layout diagram 800A-800C, is generated corresponding to a memory macro structure in which a TSV extends through the memory macro structure, thereby realizing the benefits discussed above with respect to memory macro structure 100. Further, by placing a layout diagram of a memory macro and separately arranging a plurality of TSV regions, design flexibility is improved over approaches in which arranging a plurality of TSV regions is not separate from placing a layout diagram of a memory macro.

Figure 9:
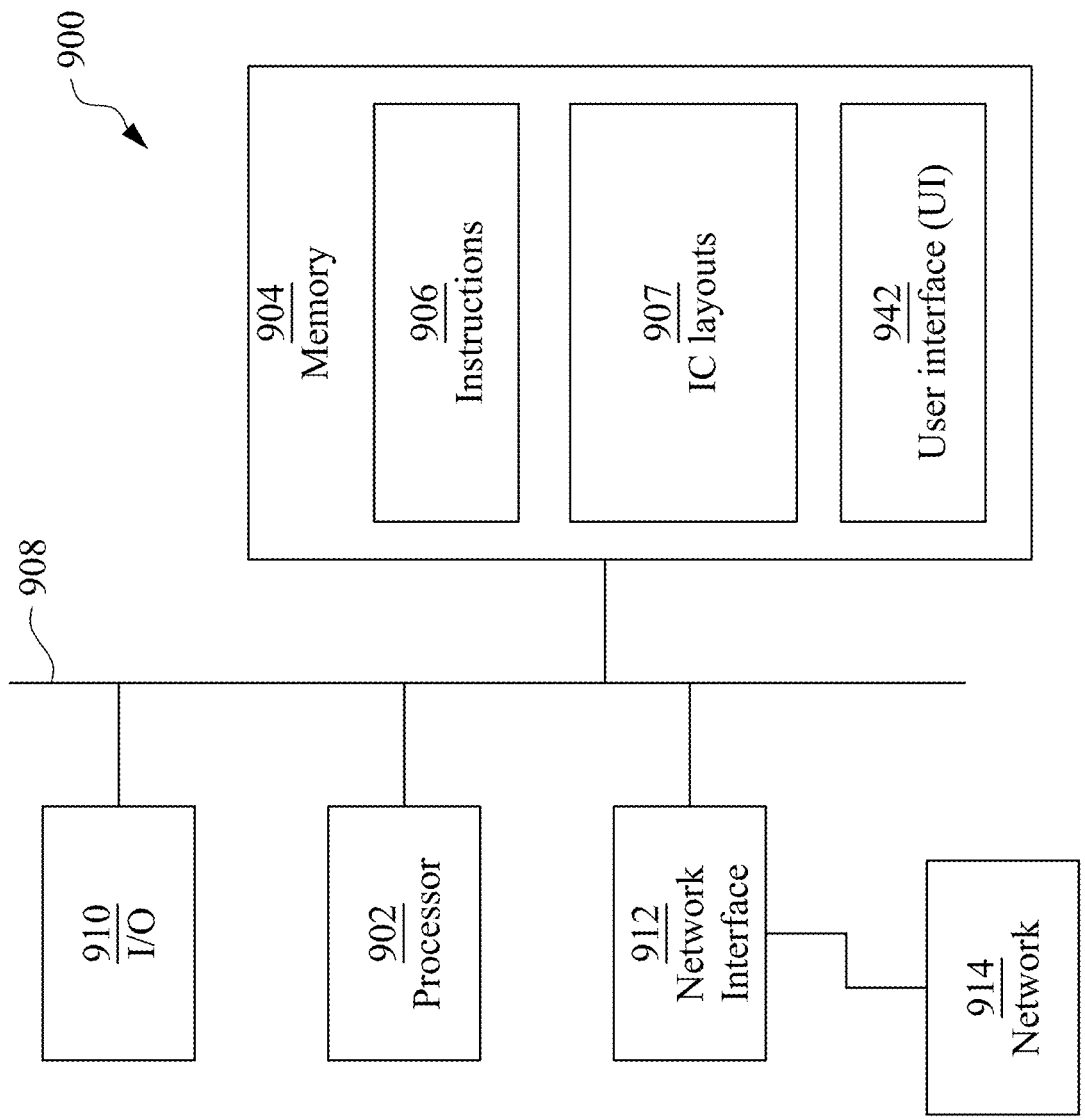
FIG. 9 is a block diagram of an IC layout diagram generation system, in accordance with some embodiments.

FIG. 9 is a block diagram of IC layout diagram generation system 900, in accordance with some embodiments. Methods described herein of designing IC layout diagrams in accordance with one or more embodiments are implementable, for example, using IC layout diagram generation system 900, in accordance with some embodiments.

In some embodiments, IC layout diagram generation system 900 is a general purpose computing device including a hardware processor 902 and non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of a method, e.g., method 700 of generating an IC layout diagram described above (hereinafter, the noted processes and/or methods).

Processor 902 is electrically coupled to computer-readable storage medium 904 via a bus 908. Processor 902 is also electrically coupled to an I/O interface 910 by bus 908. Network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause IC layout diagram generation system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause IC layout diagram generation system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores IC die library 907 of IC dies including IC layout diagram 800A and/or 800B discussed above with respect to FIGS. 8A-8C.

IC layout diagram generation system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

IC layout diagram generation system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 900.

IC layout diagram generation system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. IC layout diagram generation system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
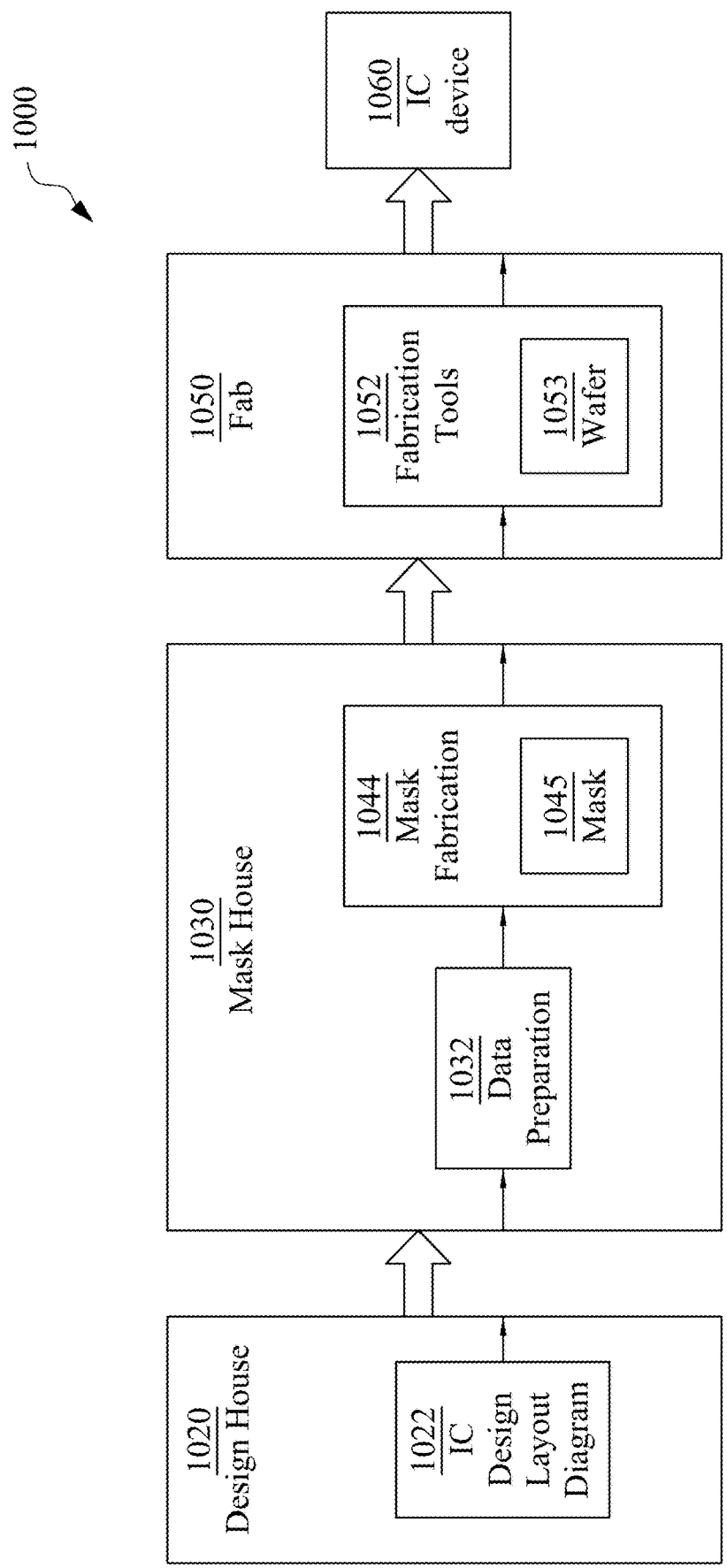
FIG. 10 is a block diagram of an IC manufacturing system, and an IC manufacturing flow associated therewith, in accordance with some embodiments.

FIG. 10 is a block diagram of IC manufacturing system 1000, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns, e.g., an IC layout diagram discussed above. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes wafer fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an IC manufacturing system (e.g., system 1000 of FIG. 10), and an IC manufacturing flow associated therewith are found, e.g., in U.S. Pat. No. 9,256, 709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a memory macro structure includes a first memory array, a second memory array, a cell activation circuit coupled to the first and second memory arrays and positioned between the first and second memory arrays, a control circuit coupled to the cell activation circuit and positioned adjacent to the cell activation circuit, and a TSV extending through one of the cell activation circuit or the control circuit. In some embodiments, the cell activation circuit includes a first portion coupled to the first memory array and a second portion coupled to the second memory array, the TSV extends though the cell activation circuit between the first portion and the second portion, and the control circuit is configured to communicate a first set of pre-decode signals to the first portion and a second set of pre-decode signals to the second portion. In some embodiments, the first and second portions are separated by a dummy area, and the TSV extends through the dummy area. In some embodiments, the TSV extends though the control circuit, and the control circuit is configured to communicate a single set of pre-decode signals to the cell activation circuit. In some embodiments, the TSV is a first TSV, the control circuit is a local control circuit, the memory macro structure includes a global control circuit coupled to the local control circuit, and a second TSV extends through the global control circuit. In some embodiments, the cell activation circuit is a first cell activation circuit, the TSV is a first TSV extending through the first cell activation circuit, and the memory macro structure includes a second cell activation circuit and a second TSV extending through the second cell activation circuit. In some embodiments, the control circuit is a first local control circuit, the TSV is a first TSV extending through the first local control circuit, and the memory macro structure includes a second local control circuit and a second TSV extending through the second local control circuit. In some embodiments, the memory macro structure is one memory macro structure of a plurality of memory macro structures, each memory macro structure of the plurality of memory macro structures includes a corresponding cell activation circuit and a corresponding control circuit, the TSV is one TSV of a plurality of TSVs, and each TSV of the plurality of TSVs extends through the corresponding one of the cell activation circuit or the control circuit of a corresponding memory macro structure of the plurality of memory macro structures.

In some embodiments, an IC package includes a logic die, a substrate, and a memory die positioned between the logic die and the substrate. The memory die includes a plurality of memory macros and a plurality of TSVs spanning front and back sides of the memory die and electrically coupled to the logic die and the substrate and a TSV of the plurality of TSVs extends through, and is electrically isolated from, a memory macro of the plurality of memory macros. In some embodiments, the TSV extends through one of a cell activation circuit or a control circuit of the memory macro. In some embodiments, the TSV is one TSV of a first subset of the plurality of TSVs, each TSV of the first subset of the plurality of TSVs extends through a corresponding memory macro of the plurality of memory macros, and each TSV of a second subset of the plurality of TSVs extends through the memory die outside of each memory macro of the plurality of memory macros. In some embodiments, a pitch of the plurality of memory macros is twice as large as a pitch of the plurality of TSVs. In some embodiments, the memory die is one memory die of a plurality of memory dies positioned between the logic die and the substrate, and each memory die of the plurality of memory dies includes a corresponding plurality of memory macros and a corresponding plurality of TSVs spanning front and back sides of the corresponding memory die and electrically coupled to the logic die and the substrate, wherein a corresponding TSV of the plurality of TSVs extends through a corresponding memory macro of the plurality of memory macros. In some embodiments, the logic die, the plurality of memory dies, and the substrate are aligned along a single direction. In some embodiments, each memory macro of the plurality of memory macros includes an array of SRAM cells.

In some embodiments, a method of manufacturing a memory macro structure includes building a memory macro in a semiconductor wafer, the memory macro including a cell activation circuit and a control circuit, and constructing a TSV spanning front and back sides of the semiconductor wafer and extending through one of the cell activation circuit or the control circuit. In some embodiments, building the memory macro includes forming a dummy area including one or more dielectric layers in the one of the cell activation circuit or the control circuit, and constructing the TSV includes constructing the TSV extending through the dummy area. In some embodiments, the memory macro is a first memory macro, the TSV is a first TSV, building the memory macro includes building a second memory macro adjacent to the first memory macro, and constructing the TSV includes constructing a second TSV extending between the first and second memory macros. In some embodiments, the TSV is a first TSV, and constructing the TSV includes constructing a second TSV extending through the other of the cell activation circuit or the control circuit. In some embodiments, the method includes connecting the TSV to a power distribution structure of an IC package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory macro structure positioned in an integrated circuit (IC) die, the memory macro structure comprising:
   a first memory array;
   a second memory array;
   a cell activation circuit coupled to the first and second memory arrays and positioned between the first and second memory arrays;
   a control circuit coupled to the cell activation circuit and positioned adjacent to the cell activation circuit; and
   a through-silicon via (TSV) spanning front and backs sides of the IC die and extending through one of the cell activation circuit or the control circuit.

2. The memory macro structure of claim 1, wherein
   the cell activation circuit comprises a first portion coupled to the first memory array and a second portion coupled to the second memory array,
   the TSV extends through the cell activation circuit between the first portion and the second portion, and
   the control circuit is configured to communicate a first set of pre-decode signals to the first portion and a second set of pre-decode signals to the second portion.

3. The memory macro structure of claim 2, wherein
   the first and second portions are separated by a dummy area, and
   the TSV extends through the dummy area.

4. The memory macro structure of claim 1, wherein
   the TSV extends through the control circuit, and the control circuit is configured to communicate a single set of pre-decode signals to the cell activation circuit.

5. The memory macro structure of claim 4, wherein
the TSV is a first TSV,
the control circuit is a local control circuit,
the memory macro structure comprises a global control circuit coupled to the local control circuit, and
a second TSV extends through the global control circuit.

6. The memory macro structure of claim 1, wherein
the cell activation circuit is a first cell activation circuit,
the TSV is a first TSV extending through the first cell activation circuit, and
the memory macro structure comprises a second cell activation circuit and a second TSV extending through the second cell activation circuit.

7. The memory macro structure of claim 1, wherein
the control circuit is a first local control circuit,
the TSV is a first TSV extending through the first local control circuit, and
the memory macro structure comprises a second local control circuit and a second TSV extending through the second local control circuit.

8. The memory macro structure of claim 1, wherein
the memory macro structure is one memory macro structure of a plurality of memory macro structures positioned in the IC die,
each memory macro structure of the plurality of memory macro structures comprises a corresponding cell activation circuit and a corresponding control circuit,
the TSV is one TSV of a plurality of TSVs, and
each TSV of the plurality of TSVs extends through the corresponding one of the cell activation circuit or the control circuit of a corresponding memory macro structure of the plurality of memory macro structures.

9. An integrated circuit (IC) package comprising:
a logic die;
a substrate; and
a memory die positioned between the logic die and the substrate, wherein the memory die comprises:
  a plurality of memory macros; and
  a plurality of through-silicon vias (TSVs) spanning front and back sides of the memory die and electrically coupled to the logic die and the substrate,
  wherein a TSV of the plurality of TSVs extends through, and is electrically isolated from, a memory macro of the plurality of memory macros.

10. The IC package of claim 9, wherein the TSV extends through one of a cell activation circuit or a control circuit of the memory macro.

11. The IC package of claim 9, wherein
the TSV is one TSV of a first subset of the plurality of TSVs,
each TSV of the first subset of the plurality of TSVs extends through a corresponding memory macro of the plurality of memory macros, and
each TSV of a second subset of the plurality of TSVs extends through the memory die outside of each memory macro of the plurality of memory macros.

12. The IC package of claim 9, wherein a pitch of the plurality of memory macros is twice as large as a pitch of the plurality of TSVs.

13. The IC package of claim 9, wherein
the memory die is one memory die of a plurality of memory dies positioned between the logic die and the substrate, and
each memory die of the plurality of memory dies comprises:
  a corresponding plurality of memory macros; and
  a corresponding plurality of TSVs spanning front and back sides of the corresponding memory die and electrically coupled to the logic die and the substrate,
  wherein a corresponding TSV of the plurality of TSVs extends through a corresponding memory macro of the plurality of memory macros.

14. The IC package of claim 13, wherein the logic die, the plurality of memory dies, and the substrate are aligned along a single direction.

15. The IC package of claim 9, wherein each memory macro of the plurality of memory macros comprises an array of static random-access memory (SRAM) cells.

16. A method of manufacturing a memory macro structure, the method comprising:
building a memory macro in a semiconductor wafer, the memory macro comprising a cell activation circuit and a control circuit; and
constructing a through-silicon via (TSV) spanning front and back sides of the semiconductor wafer and extending through one of the cell activation circuit or the control circuit.

17. The method of claim 16, wherein
the building the memory macro comprises forming a dummy area comprising one or more dielectric layers in the one of the cell activation circuit or the control circuit, and
the constructing the TSV comprises constructing the TSV extending through the dummy area.

18. The method of claim 16, wherein
the memory macro is a first memory macro,
the TSV is a first TSV,
the building the memory macro comprises building a second memory macro adjacent to the first memory macro, and
the constructing the TSV comprises constructing a second TSV extending between the first and second memory macros.

19. The method of claim 16, wherein
the TSV is a first TSV, and
the constructing the TSV comprises constructing a second TSV extending through the other of the cell activation circuit or the control circuit.

20. The method of claim 16, further comprising:
connecting the TSV to a power distribution structure of an integrated circuit (IC) package.

* * * * *